(12) United States Patent
Chen et al.

(10) Patent No.: US 12,146,506 B2
(45) Date of Patent: Nov. 19, 2024

(54) TWO-PHASE COLD PLATE

(71) Applicant: Auras Technology Co., Ltd., New Taipei (TW)

(72) Inventors: Chien-Yu Chen, New Taipei (TW); Tian-Li Ye, New Taipei (TW); Chun-Ming Hu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 233 days.

(21) Appl. No.: 17/861,666

(22) Filed: Jul. 11, 2022

(65) Prior Publication Data

US 2023/0065557 A1 Mar. 2, 2023

Related U.S. Application Data

(60) Provisional application No. 63/237,328, filed on Aug. 26, 2021.

(51) Int. Cl.
| | |
|---|---|
| *F04D 29/58* | (2006.01) |
| *F04D 29/42* | (2006.01) |
| *H05K 7/20* | (2006.01) |
| *F04D 17/02* | (2006.01) |
| *F04D 25/06* | (2006.01) |

(52) U.S. Cl.
CPC ..... *F04D 29/5806* (2013.01); *F04D 29/4293* (2013.01); *H05K 7/20254* (2013.01); *H05K 7/20272* (2013.01); *H05K 7/20327* (2013.01); *H05K 7/2039* (2013.01); *H05K 7/20418* (2013.01); *F04D 17/025* (2013.01); *F04D 25/06* (2013.01); *F04D 29/426* (2013.01); *F04D 29/588* (2013.01); *H05K 7/20318* (2013.01)

(58) Field of Classification Search
CPC .... F04D 29/5806; F04D 29/426; F04D 25/06; F04D 29/4266; F04D 29/4293; F04D 17/025; H05K 7/20254; H05K 7/20272; H05K 7/20318; H05K 7/20327; H05K 7/2039; H05K 7/20418
See application file for complete search history.

(56) References Cited

U.S. PATENT DOCUMENTS

| | | | |
|---|---|---|---|
| 6,366,462 B1* | 4/2002 | Chu | H01L 23/427 257/714 |
| 6,994,151 B2* | 2/2006 | Zhou | H01L 23/427 174/15.1 |
| 7,213,636 B2* | 5/2007 | Bhatti | H01L 23/4735 165/80.4 |

(Continued)

*Primary Examiner* — Tho V Duong
(74) *Attorney, Agent, or Firm* — Muncy, Geissler, Olds & Lowe, P.C.

(57) ABSTRACT

A two-phase cold plate includes a base, an upper cover, a heat exchange cavity and a cooling fin module. The upper cover is installed on the base, the heat exchange cavity is formed between the base and the upper cover, and the cooling fin module is installed in the heat exchange cavity. The upper cover includes at least one nozzle module and a plurality of two-phase fluid channels. The two-phase fluid channels are respectively located on both sides of the nozzle module, and the nozzle module sprays a heat dissipating fluid to the cooling fin module, and the heat dissipating fluid flows along the cooling fin module to the two-phase fluid channels on both sides of the cooling fin module to cool the cooling fin module.

12 Claims, 6 Drawing Sheets

(56) References Cited

U.S. PATENT DOCUMENTS

| | | | |
|---|---|---|---|
| 7,450,386 B2 * | 11/2008 | Silverstein | H01L 23/427 |
| | | | 174/15.1 |
| 7,597,135 B2 * | 10/2009 | Ghosh | H01L 23/4336 |
| | | | 165/80.4 |
| 7,762,314 B2 * | 7/2010 | Campbell | H01L 23/427 |
| | | | 165/80.4 |
| 9,477,275 B2 * | 10/2016 | Choudhury | H01L 23/4336 |
| 11,849,569 B2 * | 12/2023 | Zhou | H05K 7/20254 |
| 2022/0087061 A1 * | 3/2022 | Whitmore | H05K 7/20345 |

* cited by examiner

TWO-PHASE COLD PLATE

RELATED APPLICATIONS

This application claims priority to U.S. Provisional Application Ser. No. 63/237,328, filed Aug. 26, 2021, the disclosures of which are incorporated herein by reference in their entireties.

TECHNICAL FIELD

The present disclosure generally relates to a cold plate. More particularly, the present disclosure relates to a two-phase cold plate.

BACKGROUND

With the advancement of technology, electronic products have become more popular, and gradually changed the life or work of many people. As the calculating power of the computers increases, the temperature control of the electronic components such as the central processing units is more important.

Electronic components such as the central processing units generate heat during operation and require proper cooling to achieve the best performance. In order to keep the central processing unit and other electronic components operating at a proper temperature, a liquid cooling device or an air cooling device is usually used.

In the current water-cooling heat dissipation device, the working fluid flows into the water cooling head through the pipeline, and the water cooling head contacts the surface of the electronic component, e.g. the central processing unit, to take away the heat generated by the electronic component such as the central processing unit or the like during operation, thereby reducing the operating temperature of the electronic component, and further improving the working efficiency of the electronic component.

Therefore, there is a need to improve the water cooling head to improve the performance and efficiency of an electronic device with the water cooling head.

SUMMARY

One objective of the embodiments of the present invention is to provide a two-phase cold plate to improve the heat dissipation efficiency thereof so as to further reduce a working temperature of an electronic device with the same.

To achieve these and other advantages and in accordance with the objective of the embodiments of the present invention, as the embodiment broadly describes herein, the embodiments of the present invention provides a two-phase cold plate including a base, an upper cover, a heat exchange cavity and a cooling fin module. The upper cover is installed on the base, the heat exchange cavity is formed between the base and the upper cover, and the cooling fin module is installed in the heat exchange cavity. The upper cover includes at least one nozzle module and a plurality of two-phase fluid channels located on both sides of the at least one nozzle module. The at least one nozzle module sprays a heat dissipating fluid to the cooling fin module, and the heat dissipating fluid flows along the cooling fin module to the two-phase fluid channels on the both sides of the at least one nozzle module to cool the cooling fin module.

In some embodiments, the nozzle module includes a first nozzle module and a plurality of second nozzle modules respectively located on both sides of the first nozzle module.

In some embodiments, the cooling fin module further includes a middle guiding groove aligned with the first nozzle module.

In some embodiments, an entrance hole of the first nozzle module is smaller than entrance holes of the second nozzle modules.

In some embodiments, the first nozzle module or the second nozzle module includes a plurality of front nozzles, at least one slotted nozzle and a plurality of rear nozzles. The front nozzles, the slotted nozzle and the rear nozzles are arranged in sequence.

In some embodiments, the front nozzles and the rear nozzles are round nozzles.

In some embodiments, each two-phase fluid channel includes a two-phase fluid guiding surface and an exit hole. In addition, a height of the two-phase fluid guiding surface is gradually increased from an entrance hole to the exit hole.

In some embodiments, a cross sectional area of the entrance hole is smaller than a cross sectional area of the exit hole.

In some embodiments, the two-phase fluid guiding surface includes a first guiding surface and a second guiding surface. In addition, a slope of the second guiding surface is greater than a slope of the first guiding surface.

In some embodiments, the first guiding surface is a first order linear surface, and the second guiding surface is a second order or higher order surface.

In some embodiments, a joint position of the first guiding surface and the second guiding surface is located at a rear portion of the two-phase fluid guiding surface.

In some embodiments, the two-phase cold plate further includes two pipeline connection modules respectively connected to a front end and a rear end of the upper cover.

In some embodiments, each pipeline connection module includes a pipe connector and a fluid guiding device. The pipe connector is connected to a heat dissipating fluid pipe and the fluid guiding device is connected between the upper cover and the pipe connector.

In some embodiments, the fluid guiding device includes a liquid inlet/outlet opening and two guiding surfaces. The guiding surfaces are respectively located on both sides of the liquid inlet/outlet opening to guide the heat dissipating fluid flowing into/out of the heat exchange cavity.

Hence, the two-phase fluid guiding surface of the two-phase cold plate of the present invention can guide the heat dissipating fluid with the phase change to conduct heat exchange, and by the design of the inclined surface of the two-phase cold plate, the area of the exit hole greater than the area of the entrance hole of the two-phase cold plate and the volume of the fluid flowing space, formed by the two-phase fluid guiding surface, gradually increased from the entrance hole to the exit hole, the increase of the internal pressure of the heat dissipating fluid caused by the expansion of the heat dissipating fluid under a phase change in the fluid flowing space can be reduced so as to effectively prevent from fluctuating the boiling point of the heat dissipating fluid when the dissipating fluid undergoes a phase change. For example, an increase of the boiling point of the heat dissipating fluid can be avoided and the vaporized heat dissipating fluid can be effectively guided. Therefore, a better heat dissipation efficiency and a better heat dissipation capability can be achieved.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
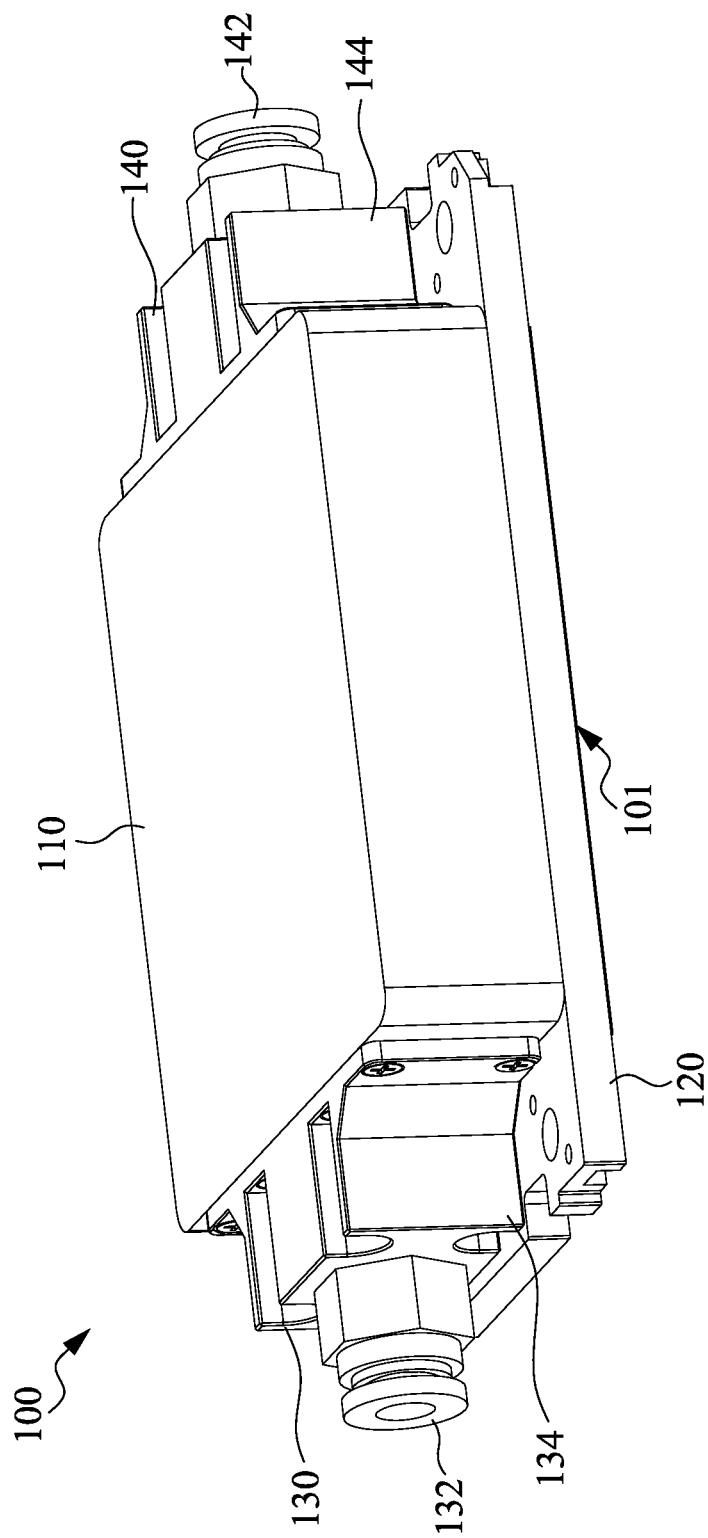
FIG. 1 illustrates a schematic perspective view showing a two-phase cold plate according to one embodiment of the present invention.
Figure 2:
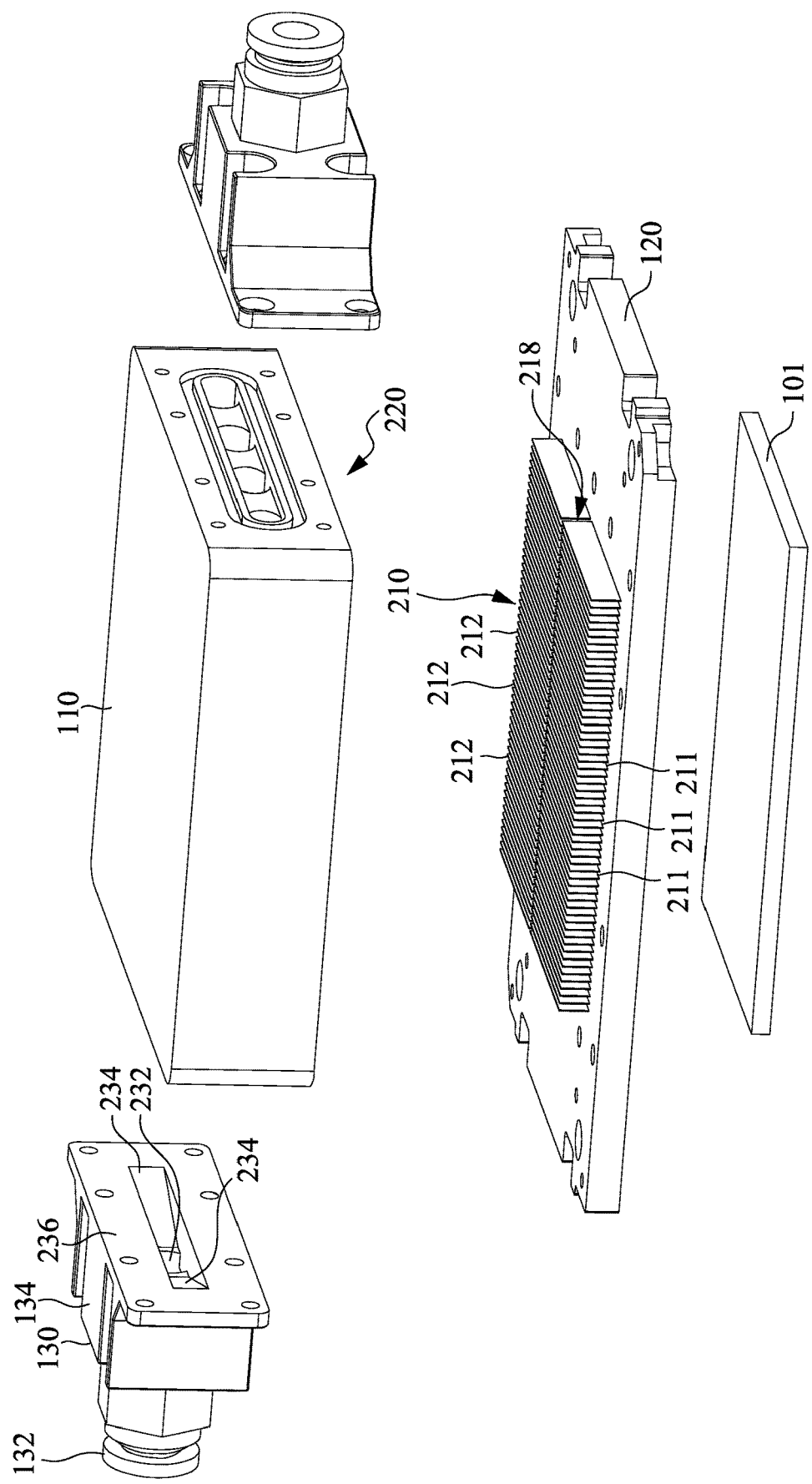
FIG. 2 illustrates a schematic exploded view of the two-phase cold plate shown in FIG. 1.
Figure 3:
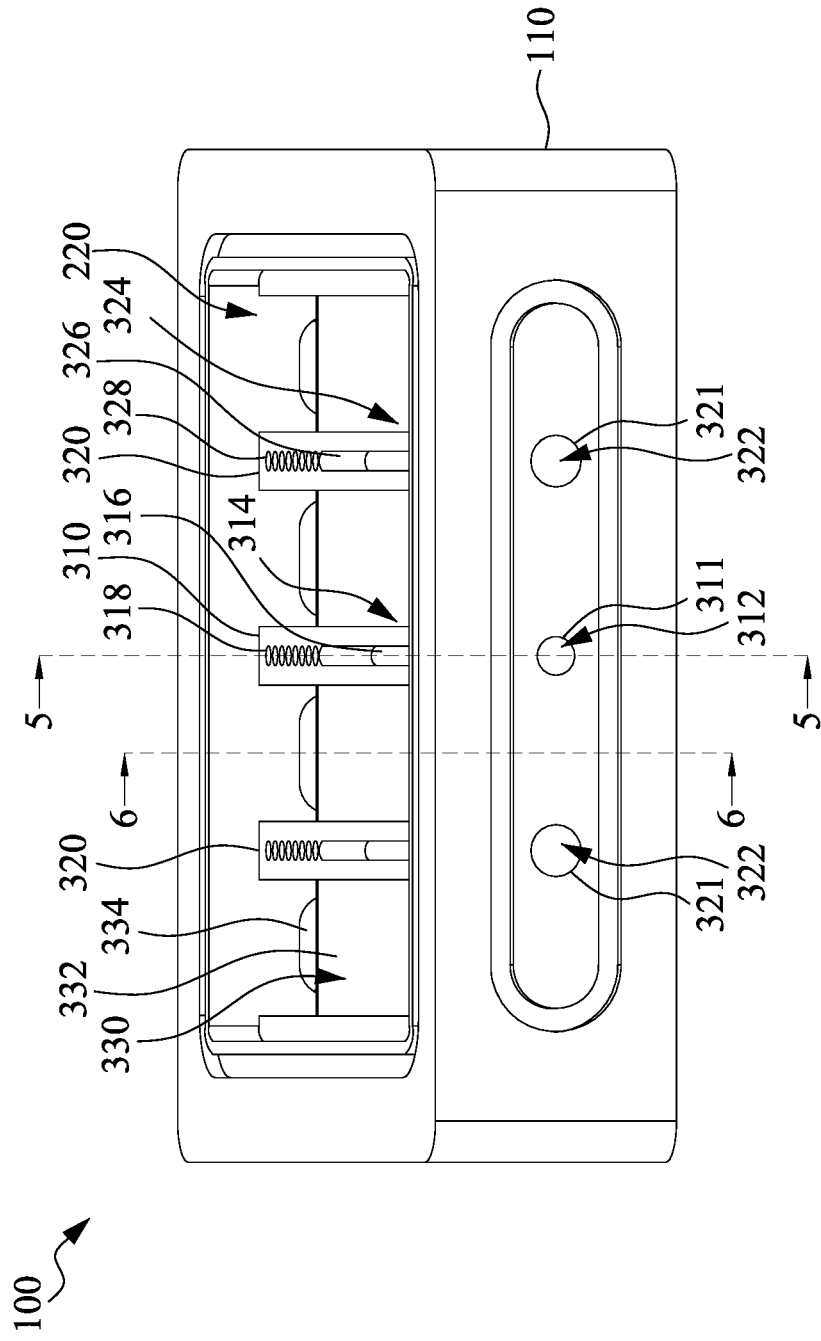
FIG. 3 is a schematic perspective bottom view of an upper cover of the two-phase cold plate shown in FIG. 1.
Figure 4:
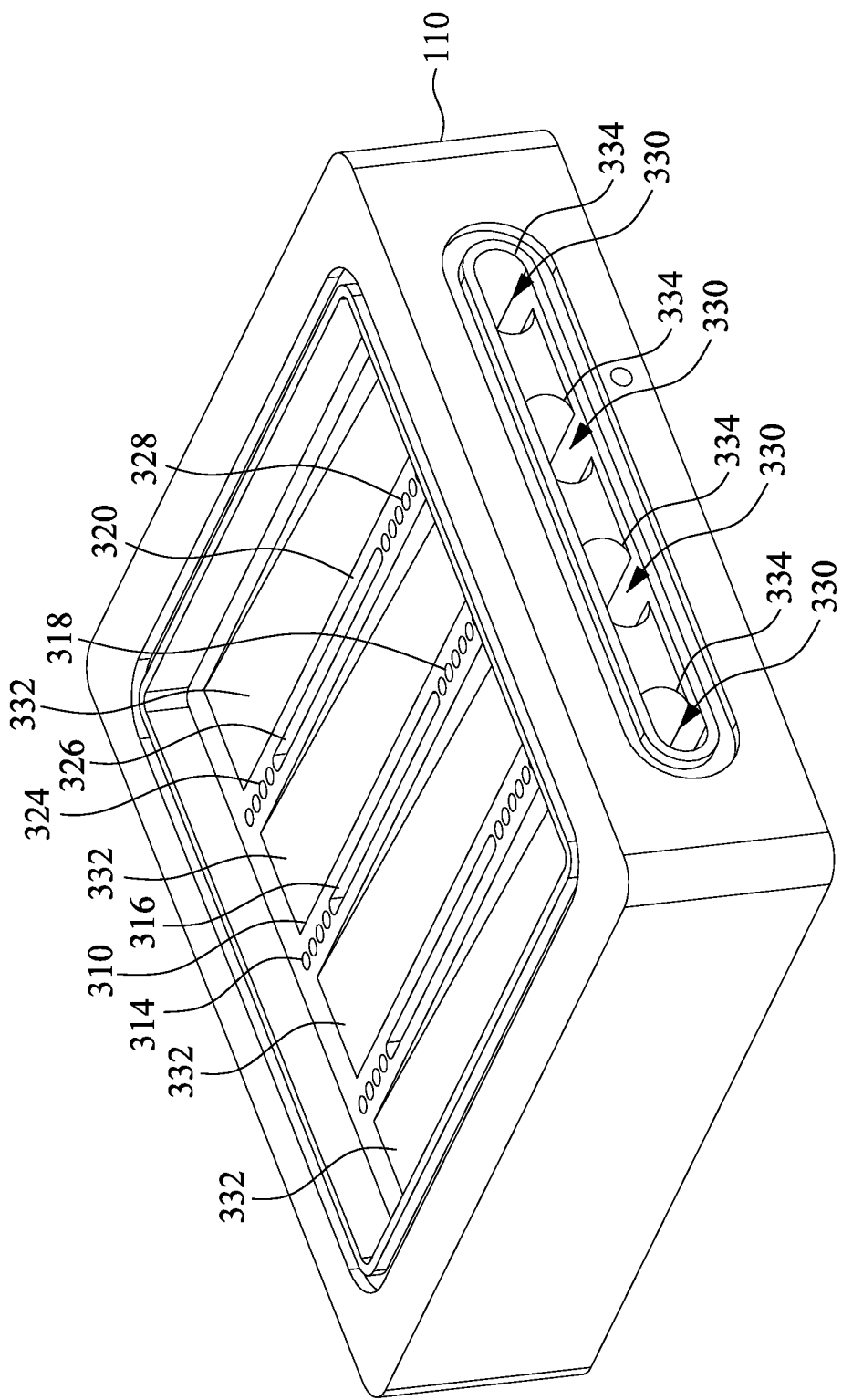
FIG. 4 is another schematic perspective bottom view of the upper cover of the two-phase cold plate shown in FIG. 1.
Figure 5:
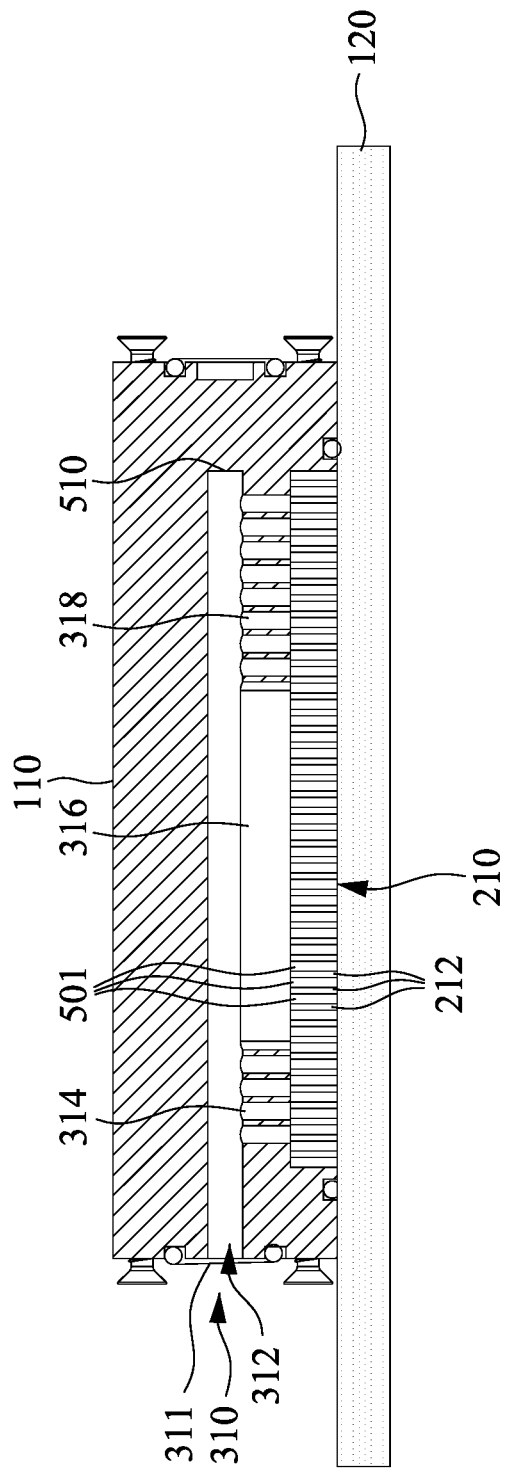
FIG. 5 is a schematic partial cross-sectional view of the two-phase cold plate shown in FIG. 1 at a corresponding position taken along line 5-5 in FIG. 3.
Figure 6:
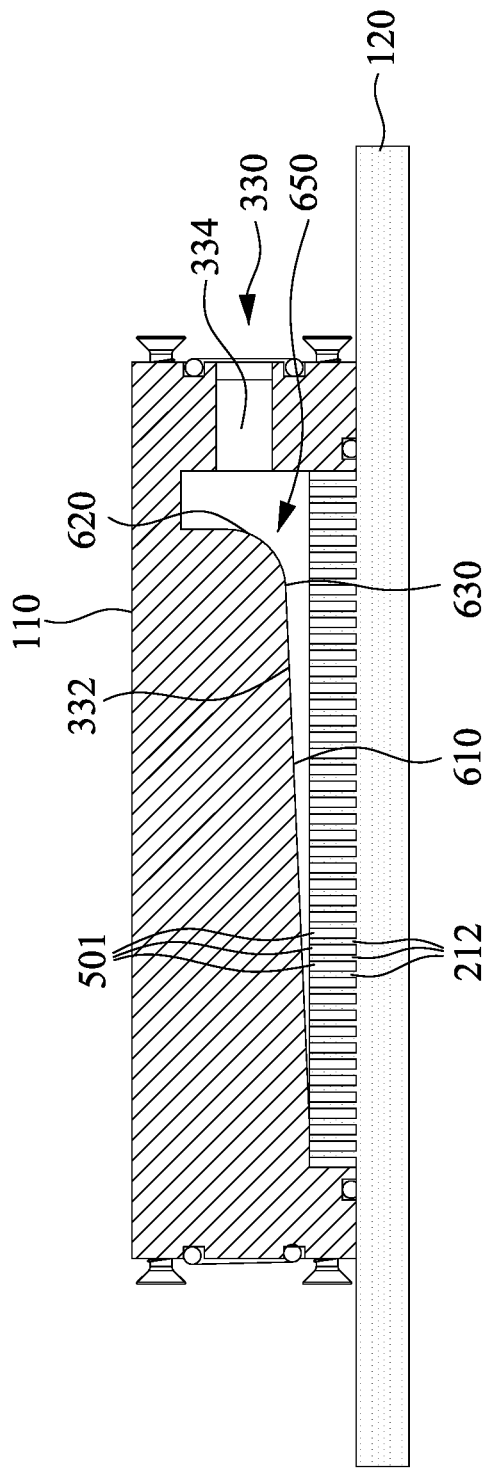
FIG. 6 is a schematic partial cross-sectional view of the two-phase cold plate shown in FIG. 1 at a corresponding position taken along line 6-6 in FIG. 3.

FIG. 1 illustrates a schematic perspective view showing a two-phase cold plate according to one embodiment of the present invention, FIG. 2 illustrates a schematic exploded view thereof, FIG. 3 is a schematic perspective bottom view of an upper cover thereof, FIG. 4 is another schematic perspective bottom view thereof, FIG. 5 is a schematic partial cross-sectional view thereof at a corresponding position taken along line 5-5 in FIG. 3, and FIG. 6 is a schematic partial cross-sectional view thereof at a corresponding position taken along line 6-6 in FIG. 3.

First referring to FIG. 1 and FIG. 2, the two-phase cold plate 100 includes a base 120, an upper cover 110, a heat exchange cavity 220 and a cooling fin module 210. The upper cover 110 is installed on the base 120, the heat exchange cavity 220 is formed between the base 120 and the upper cover 110, and the cooling fin module 210 is installed in the heat exchange cavity 220. In addition, simultaneously referring to FIG. 3, the upper cover 110 includes at least one nozzle module, for example, a first nozzle module 310 and/or second nozzle modules 320, and a plurality of two-phase fluid channels 330. The two-phase fluid channels 330 are located on both sides of the first nozzle module 310 and the second nozzle modules 320. The first nozzle module 310 and the second nozzle modules 320 spray a heat dissipating fluid to the cooling fin module 210. In addition, the heat dissipating fluid flows along the fins 211 and the fins 212 of the cooling fin module 210 to two-phase fluid channels 330 on both sides of the cooling fin module 210 to cool the cooling fin module 210, and further cool a heat source 101, i.e. a central processing unit, a graphics processing unit or any other heating electronic components, installed under the two-phase cold plate 100.

In some embodiments, the cooling fin module 210 includes skived fins.

In some embodiments, the second nozzle modules 320 are located on both sides of the first nozzle module 310, a middle guiding groove 218 is formed between the fins 211 and the fins 212 of the cooling fin module 210, and the first nozzle module 310 is aligned with the middle guiding groove 218 of the cooling fin module 210.

In some embodiments, simultaneously referring to FIG. 5, the first nozzle module 310 includes an entrance hole 311, a guiding channel 312, a plurality of front nozzles 314, at least one slotted nozzle 316 and a plurality of rear nozzles 318. In addition, the entrance hole 311 connects to the guiding channel 312, and the guiding channel 312 connects to the front nozzles 314, the slotted nozzle 316 and the rear nozzles 318 arranged in sequence to guide the heat dissipating fluid to spray into the cooling fin module 210.

In some embodiments, the front nozzles 314 and the rear nozzles 318, for example round nozzles, may increase the velocity of the heat dissipating fluid to deeply enter into the grooves 501 between the fins 212 of the cooling fin module 210 to improve the heat dissipation efficiency and the heat dissipation capability. In addition, the slotted nozzle 316, for example an oblong nozzle, increases the injection flow rate of the heat dissipating fluid so as to further improve the heat dissipation efficiency and the heat dissipation capability thereof. The grooves 501 between the fins 212 can guide the heat dissipating fluid to both sides of the first nozzle module 310, and then the heat dissipating fluid enters into the two-phase fluid channels 330 adjacent to the first nozzle module 310. In addition, the guiding channel 312 has an end surface 510, at the other end, opposite to the entrance hole 311, of the guiding channel 312 to seal the guiding channel 312 so as to force the heat dissipating fluid to enter into adjacent two-phase fluid channels 330.

In some embodiments, similar to the first nozzle module 310, the second nozzle modules 320 also includes an entrance hole 321, a guiding channel 322, a plurality of front nozzles 324, at least one slotted nozzle 326 and a plurality of rear nozzles 328. In addition, the entrance hole 321 connects to the guiding channel 322, and the guiding channel 322 connects to the front nozzles 324, the slotted nozzle 326 and the rear nozzles 328 arranged in sequence to guide the heat dissipating fluid to spray into the cooling fin module 210. Similarly, the front nozzles 324 and the rear nozzles 328, for example round nozzles, may increase the velocity of the heat dissipating fluid to deeply enter into the cooling fin module 210 to improve the heat dissipation efficiency and the heat dissipation capability. In addition, the slotted nozzle 326, for example an oblong nozzle, increases the injection flow rate of the heat dissipating fluid so as to further improve the heat dissipation efficiency and the heat dissipation capability thereof. Similarly, the grooves between the fins 212 or fins 211 can guide the heat dissipating fluid to both sides of the second nozzle module 320, and then the heat dissipating fluid enters into the two-phase fluid channels 330 adjacent to the second nozzle module 320. In addition, the guiding channel 322 has a sealed end opposite to the entrance hole 321 of the guiding channel 322 to seal the guiding channel 322 so as to force the heat dissipating fluid to enter into adjacent two-phase fluid channels 330.

In some embodiments, the first nozzle module 310 and the second nozzle modules 320 are adjacent to the upper surface of the cooling fin module 210, that is to say, the nozzles of the first nozzle module 310 and the second nozzle modules 320 can be attached to the upper surface of the cooling fin module 210.

In addition, in some embodiments, it is worth noting that an entrance hole 311 of the first nozzle module 310 is smaller than an entrance hole 321 of the second nozzle modules 320.

In some embodiments, the two-phase cold plate 100 further includes a pipeline connection module 130 and a pipeline connection module 140 respectively connect to a front end and a rear end of the upper cover 110. The pipeline connection module 130 includes a pipe connector 132 and a fluid guiding device 134. The pipe connector 132 is utilized to connect to a heat dissipating fluid pipe, and the fluid guiding device 134 is connected between the upper cover 110 and the pipe connector 132. Similarly, the pipeline connection module 140 also includes a pipe connector 142 and a fluid guiding device 144. The pipe connector 142 is utilized to connect to a heat dissipating fluid pipe, and the fluid guiding device 144 is connected between the upper cover 110 and the pipe connector 142.

In some embodiments, the pipeline connection module 130 is taken as an example, the fluid guiding device 134 includes a liquid inlet/outlet opening 232 and two guiding surfaces 234, and the guiding surfaces 234 are respectively located on both sides of the liquid inlet/outlet opening 232 to guide the heat dissipating fluid to flows into or out of the heat exchange cavity 220. It is worth noting that when the pipeline connection modules 130 are installed to the upper cover 110, joint surface 236 of the fluid guiding device 134 are coupled to the upper cover 110, and the liquid inlet/outlet opening 232 is aligned with the entrance hole 311 of the first nozzle module 310. In addition, the guiding surfaces 234 guide the heat dissipating fluid to the entrance holes 321 of the second nozzle modules 320.

In some embodiments, the two-phase fluid channel 330 includes a two-phase fluid guiding surface 332 and an exit hole 334, and a height of the two-phase fluid guiding surface 332 is gradually increased from the entrance hole 311 of the two-phase cold plate 100 to the exit hole 334 thereof so as to increase the height and volume of a fluid flowing space 650.

In some embodiments, the two-phase fluid guiding surface 332 includes a first guiding surface 610 and a second guiding surface 620, and the slope of the second guiding surface 620 is greater than the slope of the first guiding surface 610. In addition, a joint position 630 of the first guiding surface 610 and the second guiding surface 620 is located at a rear portion of the rear nozzles 318, that is to say, adjacent to the rear portion of the two-phase fluid guiding surface 332. In some embodiments, the joint position 630 is located at a rear half portion of the two-phase fluid guiding surface 332, for example a position adjacent to the exit hole 334 of the two-phase fluid channel 330, and preferably less than a ¼ length of the two-phase fluid guiding surface 332 apart from the exit hole 334.

In some embodiments, the first guiding surface 610 is a first order linear surface, and the second guiding surface 620 is a second order or higher order surface, but not limited thereto.

In some embodiments, the cross sectional area of the exit hole 334 is greater than a cross sectional area of the entrance hole 311.

Accordingly, the two-phase fluid guiding surface of the two-phase cold plate according to the present invention may guide the heat dissipating fluid with the phase change to conduct heat exchange, and by the design of the inclined surface of the two-phase cold plate and the area of the exit hole greater than the area of the entrance hole of the two-phase cold plate, the two-phase cold plate can guide the vaporized heat dissipating fluid to the exit hole to achieve a better heat dissipation efficiency and a better heat dissipation capability. In addition, by way of the two-phase fluid guiding surface, the vaporized heat dissipating fluid can be guided to the exit hole to avoid an accumulation phenomenon in a fluid flowing space. Besides, since the volume of the fluid flowing space is gradually increased from the entrance hole to the exit hole, the increase of the internal pressure of the heat dissipating fluid caused by the expansion of the heat dissipating fluid under a phase change in the fluid flowing space can be reduced so as to effectively prevent from fluctuating the boiling point of the heat dissipating fluid when the dissipating fluid undergoes a phase change. For example, an increase of the boiling point of the heat dissipating fluid phenomenon can be avoided. Therefore, the heat dissipation efficiency and the heat dissipation capability of the two-phase cold plate can be improved and the stability of the two-phase cold plate can be further improved.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A two-phase cold plate, comprising:
a base;
an upper cover installed on the base;
a heat exchange cavity formed between the base and the upper cover; and
a cooling fin module installed in the heat exchange cavity, wherein the upper cover comprises:
at least one nozzle module; and
a plurality of two-phase fluid channels located on both sides of the at least one nozzle module, wherein the at least one nozzle module sprays a heat dissipating fluid to the cooling fin module, and the heat dissipating fluid flows along the cooling fin module to the two-phase fluid channels on the both sides of the at least one nozzle module to cool the cooling fin module, wherein the at least one nozzle module comprises:
a first nozzle module; and
a plurality of second nozzle modules respectively located on both sides of the first nozzle module, wherein an entrance hole of the first nozzle module is smaller than entrance holes of the second nozzle modules, wherein at least one of the first nozzle module and the second nozzle modules comprises:
a plurality of front nozzles;
at least one slotted nozzle; and
a plurality of rear nozzles, the front nozzles, the at least one slotted nozzle and the rear nozzles arranged in sequence.

2. The two-phase cold plate of claim 1, wherein the cooling fin module further comprises a middle guiding groove aligned with the first nozzle module.

3. The two-phase cold plate of claim 1, wherein the front nozzles and the rear nozzles are round nozzles.

4. The two-phase cold plate of claim 1, wherein each of the two-phase fluid channels comprises:
a two-phase fluid guiding surface; and
an exit hole, wherein a height of the two-phase fluid guiding surface is gradually increased from an entrance hole to the exit hole.

5. The two-phase cold plate of claim 4, wherein a cross sectional area of the entrance hole is smaller than a cross sectional area of the exit hole.

6. The two-phase cold plate of claim 4, wherein the two-phase fluid guiding surface comprises:
a first guiding surface; and a second guiding surface, wherein a slope of the second guiding surface is greater than a slope of the first guiding surface.

7. The two-phase cold plate of claim 6, wherein the first guiding surface is a first order linear surface, and the second guiding surface is a second order or higher order surface.

8. The two-phase cold plate of claim 6, wherein a joint position of the first guiding surface and the second guiding surface is located at a rear portion of the two-phase fluid guiding surface.

9. The two-phase cold plate of claim 1, further comprising two pipeline connection modules respectively connected to a front end and a rear end of the upper cover.

10. The two-phase cold plate of claim 9, wherein each of the pipeline connection modules comprises:
    a pipe connector connected to a heat dissipating fluid pipe; and
    a fluid guiding device connected between the upper cover and the pipe connector.

11. The two-phase cold plate of claim 10, wherein the fluid guiding device comprises:
    a liquid inlet/outlet opening; and
    two guiding surfaces respectively located on both sides of the liquid inlet/outlet opening to guide the heat dissipating fluid flowing into/out of the heat exchange cavity.

12. A two-phase cold plate, comprising:
    a base;
    an upper cover installed on the base;
    a heat exchange cavity formed between the base and the upper cover; and
    a cooling fin module installed in the heat exchange cavity, wherein the upper cover comprises:
    at least one nozzle module; and
    a plurality of two-phase fluid channels located on both sides of the at least one nozzle module, wherein the at least one nozzle module sprays a heat dissipating fluid to the cooling fin module, and the heat dissipating fluid flows along the cooling fin module to the two-phase fluid channels on the both sides of the at least one nozzle module to cool the cooling fin module, wherein each of the two-phase fluid channels comprises:
    a two-phase fluid guiding surface; and
    an exit hole, wherein a height of the two-phase fluid guiding surface is gradually increased from an entrance hole to the exit hole, wherein a cross sectional area of the entrance hole is smaller than a cross sectional area of the exit hole.

* * * * *